(12) United States Patent
Megahed

(10) Patent No.: US 10,727,567 B2
(45) Date of Patent: Jul. 28, 2020

(54) SINGLE-PACKAGE WIRELESS COMMUNICATION DEVICE

(71) Applicant: Intel Corporation, Santa Clara, CA (US)

(72) Inventor: Mohamed A. Megahed, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/594,889

(22) Filed: Oct. 7, 2019

(65) Prior Publication Data

US 2020/0112082 A1 Apr. 9, 2020

Related U.S. Application Data

(60) Continuation of application No. 15/360,478, filed on Nov. 23, 2016, now Pat. No. 10,439,265, which is a
(Continued)

(51) Int. Cl.
*H01L 21/00* (2006.01)
*H01Q 1/22* (2006.01)
(Continued)

(52) U.S. Cl.
CPC ..... *H01Q 1/2291* (2013.01); *H01L 23/49838* (2013.01); *H01L 23/66* (2013.01);
(Continued)

(58) Field of Classification Search
CPC .......... H01Q 1/2291; H01Q 1/38; H01Q 1/48; H01L 23/49838; H01L 23/66; H01L 25/0652; H01L 25/0657; H01L 25/16; H01L 25/50; H01L 24/48; H01L 24/73; H01L 2223/6677; H01L 2224/16145; H01L 2224/16225; H01L 2224/3214; H01L 2224/48227; H01L 2224/73204; H01L 2224/73253; H01L 2224/73265; H01L 2225/06506; H01L 2225/0651; H01L 2225/06513; H01L 2225/06517; H01L 2225/06589; H01L 2924/00014; H01L 2924/01057; H01L 2924/01078;
(Continued)

(56) References Cited

U.S. PATENT DOCUMENTS 5,438,305 A 8/1995 Hikita et al.
6,229,216 B1 5/2001 Ma et al.
(Continued)

FOREIGN PATENT DOCUMENTS

CN 1516253 A 7/2004
CN 1554214 A 12/2004
(Continued)

OTHER PUBLICATIONS

"U.S. Appl. No. 11/394,831, Non Final Office Action dated Jul. 1, 2009", 10 pgs.
(Continued)

*Primary Examiner* — Calvin Y Choi
(74) *Attorney, Agent, or Firm* — Schwegman Lundberg & Woessner, P.A.

(57) ABSTRACT

A method, apparatus and system with an autonomic, self-healing polymer capable of slowing crack propagation within the polymer and slowing delamination at a material interface.

20 Claims, 6 Drawing Sheets

Related U.S. Application Data continuation of application No. 13/371,663, filed on Feb. 13, 2012, now abandoned, which is a division of application No. 12/714,718, filed on Mar. 1, 2010, now Pat. No. 8,138,599, which is a division of application No. 11/394,831, filed on Mar. 31, 2006, now Pat. No. 7,692,295.

(51) Int. Cl.
  H01Q 1/38      (2006.01)
  H01L 25/00     (2006.01)
  H01L 25/065    (2006.01)
  H01L 23/66     (2006.01)
  H01L 25/16     (2006.01)
  H01L 23/498    (2006.01)
  H01Q 1/48      (2006.01)
  H01L 23/00     (2006.01)

(52) U.S. Cl.
  CPC ...... *H01L 25/0652* (2013.01); *H01L 25/0657* (2013.01); *H01L 25/16* (2013.01); *H01L 25/50* (2013.01); *H01Q 1/38* (2013.01); *H01Q 1/48* (2013.01); *H01L 24/48* (2013.01); *H01L 24/73* (2013.01); *H01L 2223/6677* (2013.01); *H01L 2224/16145* (2013.01); *H01L 2224/16225* (2013.01); *H01L 2224/32145* (2013.01); *H01L 2224/48227* (2013.01); *H01L 2224/73204* (2013.01); *H01L 2224/73253* (2013.01); *H01L 2224/73265* (2013.01); *H01L 2225/0651* (2013.01); *H01L 2225/06506* (2013.01); *H01L 2225/06513* (2013.01); *H01L 2225/06517* (2013.01); *H01L 2225/06589* (2013.01); *H01L 2924/00014* (2013.01); *H01L 2924/01057* (2013.01); *H01L 2924/01078* (2013.01); *H01L 2924/01079* (2013.01); *H01L 2924/14* (2013.01); *H01L 2924/181* (2013.01); *H01L 2924/19105* (2013.01)

(58) Field of Classification Search
  CPC ....... H01L 2924/01079; H01L 2924/14; H01L 2924/181; H01L 2924/19105
  See application file for complete search history.

(56) References Cited

U.S. PATENT DOCUMENTS

| | | | |
|---|---|---|---|
| 6,258,626 | B1 | 7/2001 | Wang et al. |
| 6,278,864 | B1 | 8/2001 | Cummins et al. |
| 6,407,456 | B1 | 6/2002 | Ball |
| 6,718,163 | B2 | 4/2004 | Tandy |
| 6,734,539 | B2 | 5/2004 | Degani et al. |
| 6,770,955 | B1 | 8/2004 | Coccioli et al. |
| 7,132,747 | B2 | 11/2006 | Kwon et al. |
| 7,176,506 | B2 | 2/2007 | Beroz et al. |
| 7,692,295 | B2 | 4/2010 | Megahed |
| 8,138,599 | B2 | 3/2012 | Megahed |
| 10,439,265 | B2 | 10/2019 | Megahed |
| 2001/0052645 | A1 | 12/2001 | Op't Eynde |
| 2003/0143971 | A1 | 7/2003 | Hongo et al. |
| 2004/0014428 | A1 | 1/2004 | Franca-neto |
| 2004/0113254 | A1 | 6/2004 | Karnezos |
| 2004/0130020 | A1 | 7/2004 | Kuwabara et al. |
| 2004/0152276 | A1 | 8/2004 | Nishimura |
| 2004/0232982 | A1 | 11/2004 | Ichitsubo et al. |
| 2004/0234982 | A1 | 11/2004 | Kimura et al. |
| 2005/0119025 | A1 | 6/2005 | Mohindra et al. |
| 2005/0184398 | A1 | 8/2005 | Zhou et al. |
| 2005/0218509 | A1 | 10/2005 | Kipnis et al. |
| 2006/0113653 | A1 | 6/2006 | Xiaoqi et al. |
| 2006/0172748 | A1 | 8/2006 | Kim et al. |
| 2007/0063056 | A1 | 3/2007 | Gaucher et al. |
| 2007/0090502 | A1 | 4/2007 | Zhao et al. |
| 2012/0202436 | A1 | 8/2012 | Megahed |
| 2017/0141456 | A1 | 5/2017 | Megahed |

FOREIGN PATENT DOCUMENTS

| | | | |
|---|---|---|---|
| JP | 0786495 | A | 3/1995 |
| JP | 11265975 | A | 9/1999 |
| JP | 2000269407 | A | 9/2000 |
| JP | 2002076267 | A | 3/2002 |
| JP | 2003309483 | A | 10/2003 |
| JP | 2005303056 | A | 10/2005 |
| KR | 1020010068589 | A | 7/2001 |
| KR | 1020030033097 | A | 4/2003 |
| KR | 1020060005722 | A | 1/2006 |
| KR | 1020060020761 | A | 3/2006 |
| TW | I240388 | B | 9/2005 |
| WO | WO-2007126910 | A1 | 11/2007 |

OTHER PUBLICATIONS

"U.S. Appl. No. 11/394,831, Notice of Allowance dated Nov. 19, 2009", 11 pgs.

"U.S. Appl. No. 11/394,831, Response filed Jan. 9, 2009 to Restriction Requirement dated Dec. 12, 2008", 4 pgs.

"U.S. Appl. No. 11/394,831, Response filed May 18, 2009 to Restriction Requirement dated Apr. 21, 2009", 12 pgs.

"U.S. Appl. No. 11/394,831, Response filed Oct. 1, 2009 to Non Final Office Action dated Jul. 1, 2009", 18 pgs.

"U.S. Appl. No. 11/394,831, Restriction Requirement dated Apr. 21, 2009", 8 pgs.

"U.S. Appl. No. 11/394,831, Restriction Requirement dated Dec. 12, 2008", 6 pgs.

"U.S. Appl. No. 12/714,718, Non Final Office Action dated Jul. 14, 2011", 8 pgs.

"U.S. Appl. No. 12/714,718, Notice of Allowance dated Nov. 21, 2011", 8 pgs.

"U.S. Appl. No. 12/714,718, Response filed Oct. 14, 2011 to Non Final Office Action dated Jul. 14, 2011", 11 pgs.

"U.S. Appl. No. 13/371,663, Advisory Action dated Oct. 20, 2016", 8 pgs.

"U.S. Appl. No. 13/371,663, Final Office Action dated Jan. 29, 2015", 17 pgs.

"U.S. Appl. No. 13/371,663, Final Office Action dated Jun. 23, 2016", 20 pgs.

"U.S. Appl. No. 13/371,663, Final Office Action dated Jul. 2, 2015", 14 pgs.

"U.S. Appl. No. 13/371,663, Non Final Office Action dated Nov. 20, 2015", 16 pgs.

"U.S. Appl. No. 13/371,663, Non Final Office Action dated Nov. 27, 2013", 15 pgs.

"U.S. Appl. No. 13/371,663, Preliminary Amendment filed Jan. 2, 2013", 7 pgs.

"U.S. Appl. No. 13/371,663, Response filed Apr. 28, 2014 to Non Final Office Action dated Nov. 27, 2013", 10 pgs.

"U.S. Appl. No. 13/371,663, Response filed May 18, 2016 to Non Final Office Action dated Nov. 20, 2015", 8 pgs.

"U.S. Appl. No. 13/371,663, Response filed Sep. 22, 2016 to Final Office Action dated Jun. 23, 2016", 12 pgs.

"U.S. Appl. No. 13/371,663, Response filed Oct. 18, 2013 to Restriction Requirement dated Sep. 27, 2013", 7 pgs.

"U.S. Appl. No. 13/371,663, Response filed Nov. 2, 2015 to Final Office Action dated Jul. 2, 2015", 9 pgs.

"U.S. Appl. No. 13/371,663, Restriction Requirement dated Sep. 27, 2013", 7 pgs.

"U.S. Appl. No. 15/360,478, Examiner Interview Summary dated Apr. 9, 2019", 3 pgs.

"U.S. Appl. No. 15/360,478, Final Office Action dated Mar. 21, 2019", 7 pgs.

"U.S. Appl. No. 15/360,478, Non Final Office Action dated Oct. 3, 2018", 9 pgs.

"U.S. Appl. No. 15/360,478, Notice of Allowance dated May 30, 2019", 8 pgs.

(56) References Cited

OTHER PUBLICATIONS

"U.S. Appl. No. 15/360,478, Response filed Jan. 3, 2019 to Non Final Office Action dated Oct. 3, 2018", 8 pgs.
"U.S. Appl. No. 15/360,478, Response filed Mar. 2, 2018 to Restriction Requirement dated Jan. 4, 2018", 6 pgs.
"U.S. Appl. No. 15/360,478, Response filed May 9, 2019 to Final Office Action dated Mar. 21, 2019", 6 pgs.
"U.S. Appl. No. 15/360,478, Restriction Requirement dated Jan. 4, 2018", 7 pgs.
"Chinese Application Serial No. 200780010712.X, Office Action dated Jan. 30, 2015", w/English Translation, 24 pgs.
"Chinese Application Serial No. 200780010712.X, Office Action dated Apr. 1, 2013", w/English Translation, 22 pgs.
"Chinese Application Serial No. 200780010712.X, Office Action dated Jun. 2, 2015", w/English Translation, 24 pgs.
"Chinese Application Serial No. 200780010712.X, Office Action dated Jul. 26, 2011", w/English Translation, 36 pgs.
"Chinese Application Serial No. 200780010712.X, Office Action dated Aug. 3, 2012", w/English Translation, 24 pgs.
"Chinese Application Serial No. 201511009216.5, Decision of Reexamination—Rejection Upheld dated Feb. 13, 2020", w/ English translation, 29 pgs.
"Chinese Application Serial No. 201511009216.5, Decision of Rejection dated Mar. 5, 2019", W/ English Translation, 21 pgs.
"Chinese Application Serial No. 201511009216.5, Notice of Reexamination dated Oct. 10, 2019", W/ Concise Statement of Relevance, 19 pgs.
"Chinese Application Serial No. 201511009216.5, Office Action dated Aug. 29, 2018", W/ English Translation, 31 pgs.
"Chinese Application Serial No. 201511009216.5, Office Action dated Dec. 29, 2017", w/ English Translation, 29 pgs.
"Chinese Application Serial No. 201511009216.5, Request for Reexamination filed Jun. 18, 2019 to Decision of Rejection dated Mar. 5, 2019", w/ English claims, 18 pgs.
"Chinese Application Serial No. 201511009216.5, Response filed May 8, 2018 to Office Action dated Dec. 29, 2017", w/ English claims, 19 pgs.
"Chinese Application Serial No. 201511009216.5, Response filed Nov. 13, 2018 to Office Action dated Aug. 29, 2018", w/ English claims, 18 pgs.
"Chinese Application Serial No. 201511009216.5, Response filed Nov. 22, 2019 to Notice of Reexamination dated Oct. 10, 2019", w/ English claims, 20 pgs.
"Chinese Application Serial No. 201511009216.5, Voluntary Amendment filed Oct. 14, 2016", W/ English Translation of Claims, 12 pgs.
"International Application Serial No. PCT/US2007/007708, International Preliminary Report on Patentability dated Sep. 30, 2008", 6 pgs.
"International Application Serial No. PCT/US2007/007708, International Search Report dated Sep. 5, 2007", 3 pgs.
"International Application Serial No. PCT/US2007/007708, Written Opinion dated Sep. 5, 2007", 5 pgs.
"Japanese Application Serial No. 2008-555427, Office Action dated Sep. 28, 2010", 5 pgs.
"Korean Application Serial No. 10-2008-7023957, Office Action dated Jul. 13, 2010", w/English Translation, 15 pgs.
"Korean Application Serial No. 10-2008-7023957, Office Action dated Nov. 30, 2010", 6 pgs.
"Skyworks Breakthrough Simplicity", (2005), 1 pg.
"Taiwanese Application Serial No. 96110607, Office Action dated Jan. 20, 2011", w/English Translation, 12 pgs.
Johnson, R W, "Flip Chip Assembly and Underfilling", Area array packaging processes: for BGA, Flip Chip, and CSP, 99, (2003), 2 pgs.

SINGLE-PACKAGE WIRELESS COMMUNICATION DEVICE

CLAIM OF PRIORITY

This application is a divisional of U.S. patent application Ser. No. 12/714,718, now U.S. Pat. No. 10,439,265, which was filed on Mar. 1, 2010 and which is a divisional of U.S. patent application Ser. No. 11/394,831, now U.S. Pat. No. 7,692,295, which was filed on Mar. 31, 2006.

TECHNICAL FIELD

The invention relates to the field of microelectronics and more particularly, but not exclusively, to packaging wireless communications devices.

BACKGROUND

The evolution of integrated circuit designs has resulted in higher operating frequency, increased numbers of transistors, and physically smaller devices. This continuing trend has generated ever increasing area densities of integrated circuits and electrical connections. The trend has also resulted in higher packing densities of components on printed circuit boards and a constrained design space within which system designers may find suitable solutions. Physically smaller devices have also become increasingly mobile.

At the same time, wireless communication standards have proliferated as has the requirement that mobile devices remain networked. Consequently, many mobile devices include a radio transceiver capable of communicating according to one or more of a multitude of communication standards. Each different wireless communication standard serves a different type of network. For example, a personal area network (PAN), such as Blue Tooth (BT), wirelessly maintains device connectivity over a range of several feet. A separate wireless standard, such as IEEE 802.11a/b/g (Wi-Fi), maintains device connectivity over a local area network (LAN) that ranges from several feet to several tens of feet.

A typical radio transceiver includes several functional blocks spread among several integrated circuit packages. Further, separate packages often each contain an integrated circuit designed for a separate purpose and fabricated using a different process than that for the integrated circuit of neighboring packages. For example, one integrated circuit may be largely for processing an analog signal while another may largely be for computationally intense processing of a digital signal. The fabrication process of each integrated circuit usually depends on the desired functionality of the integrated circuit, for example, an analog circuit generally is formed from a process that differs from that used to fabricate a computationally intense digital circuit. Further, isolating the various circuits from one another to prevent electromagnetic interference may often be a goal of the designer. Thus, the various functional blocks of a typical radio transceiver are often spread among several die packaged separately.

Each package has a multitude of power, ground, and signal connections which affects package placement relative to one another. Generally, increasing the number of electrical connections on a package increases the area surrounding the package where trace routing density does not allow for placement of other packages. Thus, spreading functional blocks among several packages limits the diminishment in physical size of the radio transceiver, which in turn limits the physical size of the device in which the radio transceiver is integrated.

DETAILED DESCRIPTION

Herein disclosed are a package, a method of packaging, and a system including the package for an integrated, multi-die radio transceiver.

In the following detailed description, reference is made to the accompanying drawings which form a part hereof wherein like numerals designate like parts throughout, and in which is shown, by way of illustration, specific embodiments in which the invention may be practiced. Other embodiments may be utilized, and structural or logical changes may be made, without departing from the intended scope of the embodiments presented. It should also be noted that directions and references (e.g., up, down, top, bottom, primary side, backside, etc.) may be used to facilitate the discussion of the drawings and are not intended to restrict the application of the embodiments of this invention. Therefore, the following detailed description is not to be taken in a limiting sense and the scope of the embodiments of the present invention is defined by the appended claims and their equivalents.

Description of a Radio Transceiver

Figure 1:
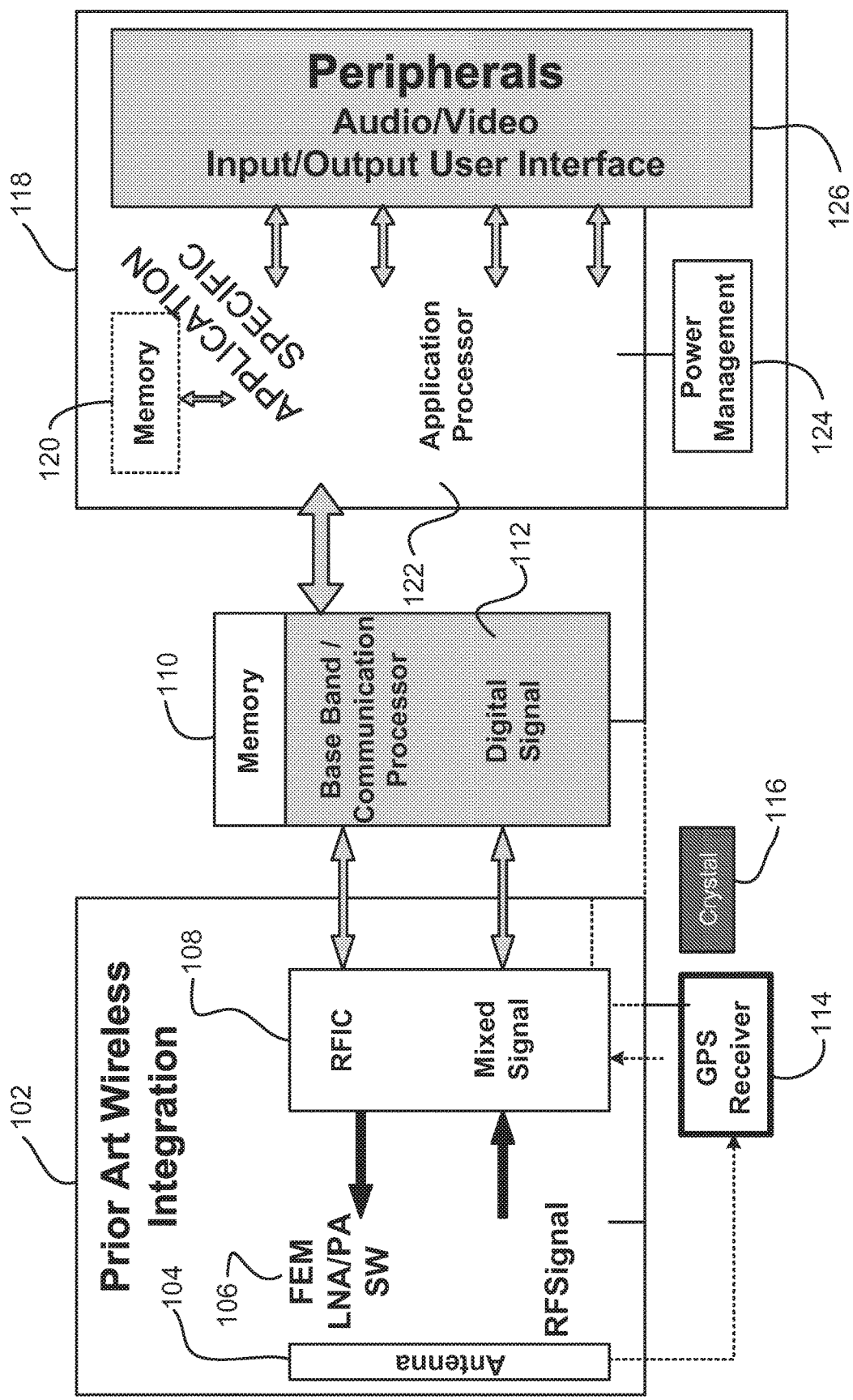
FIG. 1 illustrates a block diagram of a prior art radio transceiver application.

Please refer to FIG. 1 for a functional block diagram of a typical prior art radio transceiver application.

A typical radio transceiver usually includes several separate functional blocks, including a Front End Module (FEM) 106, a Radio Frequency Integrated Circuit (RFIC) 108, and a Base Band/Communication Processor 112, that electrically couple to application specific circuitry 118. The typical radio transceiver spreads the several functional blocks among different die and integrated circuit packages. The FEM 106 generally processes a radio frequency (RF) signal collected from an antenna 104. The FEM 106 may include a low noise amplifier for small signal receiver gain larger than about 90 dB or a power amplifier for output power in excess of about 17 dBm or about 50 mW, and passive frequency selection circuits. The FEM 106 processes the RF signal before communicating a signal to the RFIC 108 for mixed signal processing. The RFIC 108 usually converts the RF signal from the FEM 106 to a digital signal and passes the digital signal to a Base Band/Communication Processor 112. The Base Band/Communication Processor 112 generally communicates with application specific circuitry 118 that often includes an application processor 122 coupled to user interface peripherals 126 and a system memory 120. In some instances, the Base Band/Communication Processor 112 is coupled to a memory 110 which may be on a separate die, or integrated into the die of the Base Band/Communication Processor 112. Power consumption for the application processor may be managed by power management circuitry 124. The RFIC 108 may also receive a signal input gathered from a Global Positioning System Receiver (GPS Receiver) 114.

The FEM 106 and RFIC 108 are often on different die because of functional differences between the circuits that may not be easily achieved through the same die fabrication process. The Base Band/Communication Processor 112 may typically perform computationally intensive operations and therefore be fabricated using yet another process that differs from either of those used to fabricate the FEM 106 or the RFIC 108. Further, the different die will often be packaged separately, although some prior art radio transceivers have integrated the FEM 106 and RFIC 108 within the same package, as indicated by the Prior Art Wireless Integration block 102. Usually, the GPS Receiver 114 will also be packaged separately from other die. Further, the reference oscillator (crystal) 116 will generally be in a different package due to its sensitivity to temperature variance.

Current packages that integrate the FEM 106 and RFIC 108 use arrays of solder bumps on the individual die to couple the die to a package substrate. Further, the die are each disposed on the substrate in a substantially two-dimensional layout. A radio frequency transceiver integrated in a single package may address many shortcomings of present radio frequency transceivers. Because the different die will often be packaged separately, current system costs will often be higher than if the various die could be included in a single package. Further, because present systems continue to evolve to smaller form factors, a radio frequency transceiver integrated into a single package may help a system designer to achieve a desired overall system size that by itself is smaller than a radio frequency transceiver spread among several packages.

Integration of a Radio Transceiver in a Single Package

Figure 2:
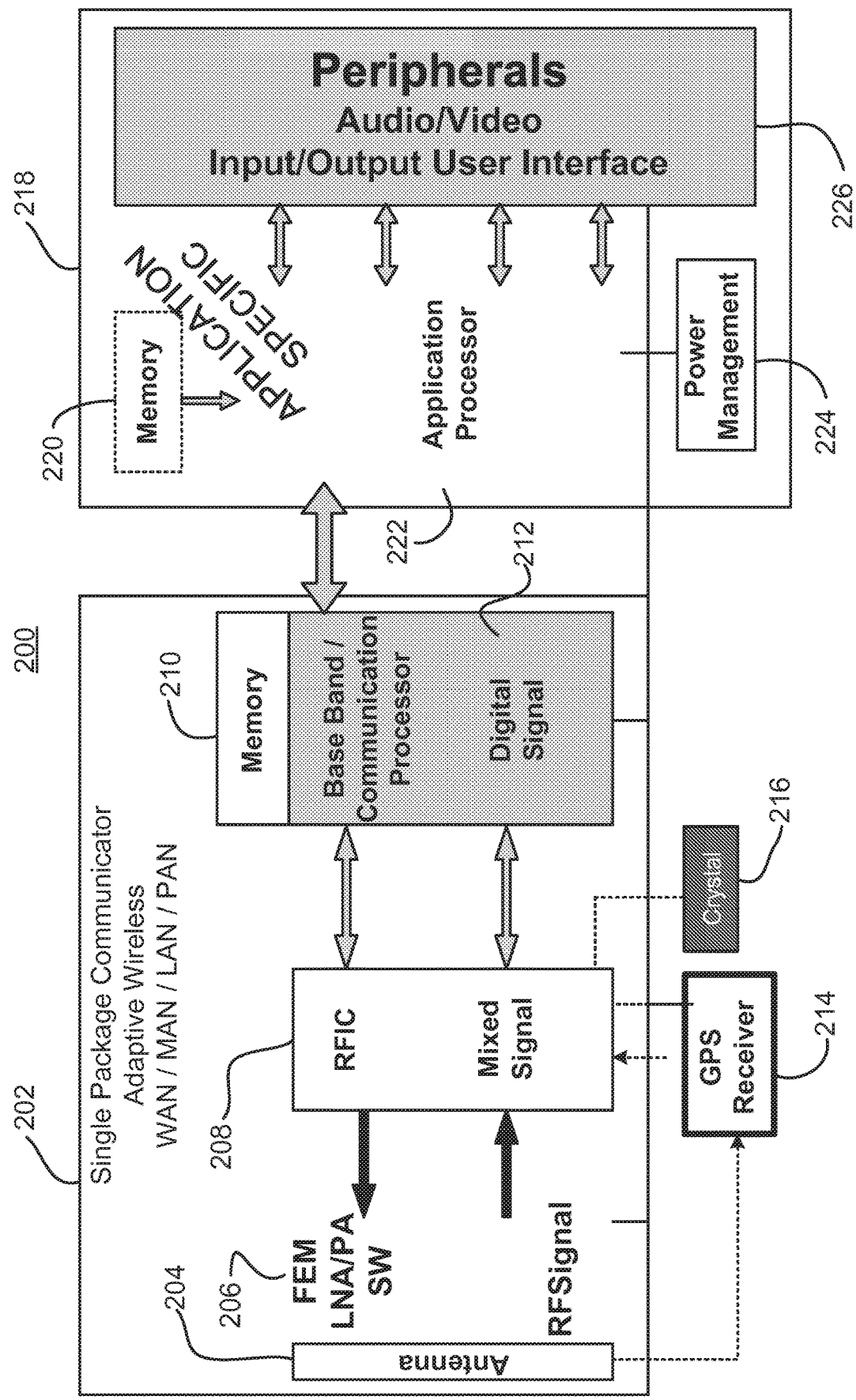
FIG. 2 illustrates a block diagram of an exemplary single package radio transceiver application.

FIG. 2 illustrates a functional block diagram of a system 200 using a radio frequency transceiver 202 wherein the radio frequency transceiver 202 is integrated into a single integrated circuit package, shown as 300 in FIG. 3 and further described below. The radio frequency transceiver 202 includes an antenna 204, an FEM (analog) 206, an RFIC (mixed analog/digital) 208, and a Base Band/Communication Processor (digital) 212. The reference oscillator (crystal) 216 resides outside the integrated circuit package 300 because of its sensitivity to temperature and mechanical stress, both of which are often unavoidable during package assembly. Some embodiments of the radio frequency transceiver 202 also include a memory 210 coupled to the Base Band/Communication Processor 212. Other embodiments of the radio frequency transceiver 202 may be capable of receiving input from other types of receivers, for example, a global positioning system receiver 214. The signal collected by the alternative receiver 214 is transmitted to the RFIC 208. The digital output of the Base Band/Communication Processor 212 couples to an application specific integrated circuit 218 that includes an application processor 222. Further, the application processor 222 couples to a memory 220, power management circuitry 224, and any peripherals 226. The peripherals 226 often include one or more of the following: an input/output interface, a user interface, an audio, a video, and an audio/video interface.

The application processor 222 often defines the standard used by the radio frequency transceiver 202. Exemplary standards may include, by way of example and not limitation, a definition for a personal area network (PAN), such as Blue Tooth (BT), that wirelessly maintains device connectivity over a range of several feet, a local area network (LAN) that ranges from several feet to several tens of feet such as IEEE 802.11a/b/g (Wi-Fi), a metropolitan area network (MAN) such as (Wi-Max), and a wide area network (WAN), for example a cellular network.

Figure 3:
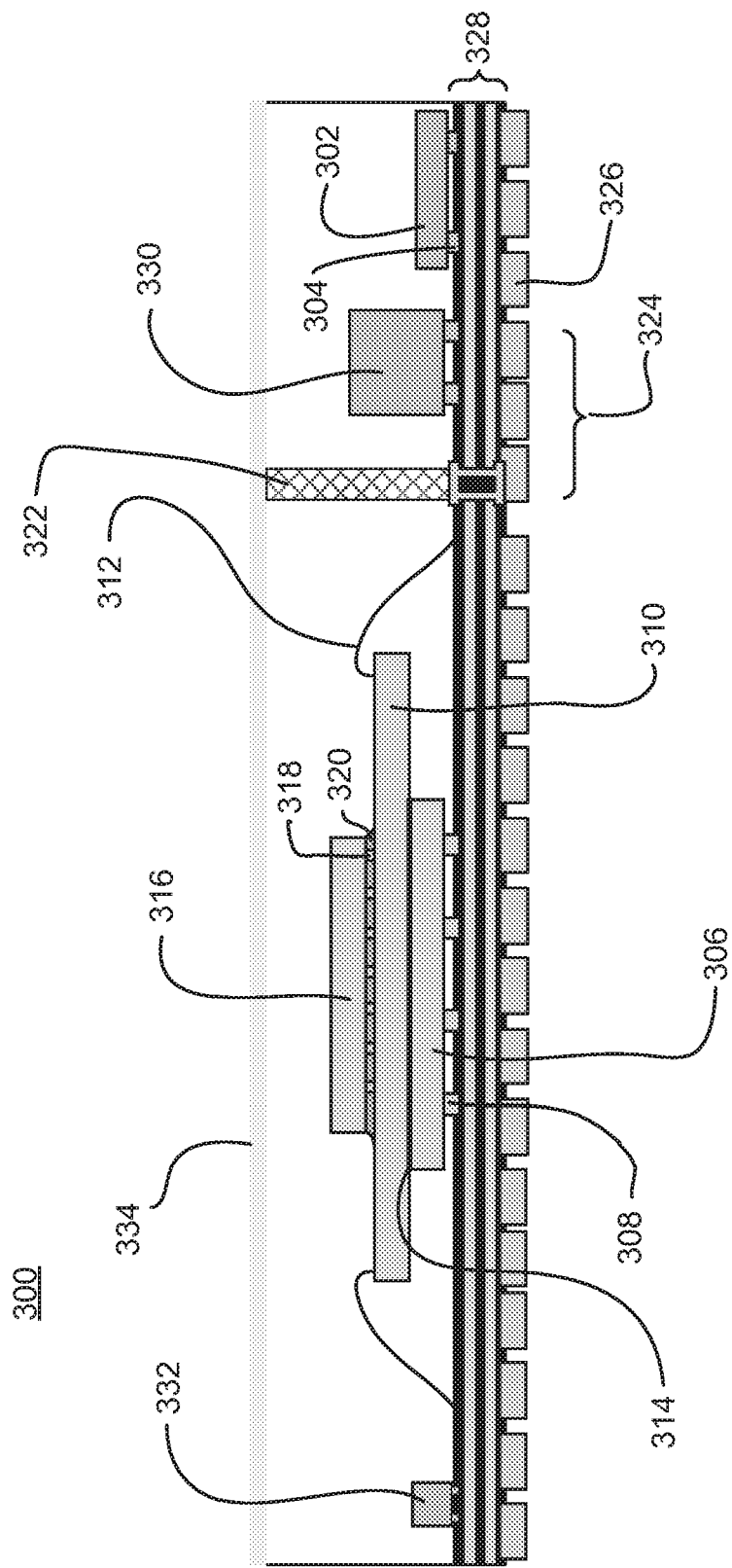
FIG. 3 illustrates a cross-sectional view of an exemplary single package radio transceiver.

An exemplary embodiment of a package 300 that integrates a radio frequency transceiver 202 is illustrated by FIG. 3 and utilizes die stacking, or packaging in a third dimension, to alleviate many of the aforementioned problems, such as limited diminishment in size and increased packaging costs, associated with prior art two-dimensional layouts. The integrated radio frequency transceiver 202 in a single package 300 includes an antenna 204 formed by a copper stud 322 and a stack of a first die 306 and a second die 310 coupled to the package substrate 328, to which is also coupled a third die 302.

In the embodiment of FIG. 3, the third die 302 forms a front end module 206 and is coupled to the substrate 328 though solder bumps 304. The third die may be formed substantially of gallium arsenide, silicon on sapphire, or silicon germanium. The second die 310 forms a Base Band/Communication Processor 210 and mechanically couples to the first die 306 that includes a radio frequency integrated circuit (RFIC) 208. The first die 306 is electrically coupled to the substrate 328, often through solder bumps 308. For first die 306 sizes less than approximately 3.5 mm×3.5 mm underfill may often not be used. Larger first die 306 may utilize underfill. The second die 310 is electrically coupled to the substrate 328 through wire bonds 312. One method of mechanically coupling the first die 306 and second die 310 includes using an interface bonding agent 314, for example an epoxy. Many interface bonding agents 314 other than epoxy are known, e.g., RTV rubbers. The package 300 includes an antenna 204 formed of a copper stud 322 that couples to a package cover 334 that may act also as a heat spreader. Also included in the embodiment illustrated by FIG. 3 is a fourth die 316 on which is formed memory 210. The fourth die 316 couples to the circuitry of the second die 310 through a direct chip attach formed of solder bumps 318 and underfill 320. Some embodiments of underfill 320 may include an adhesive tape or epoxy. Passive components 330 and 332, such as inductor based components used for tuning, may be located at convenient locations on the substrate 328 if they are not included in the die 306 including the RFIC 208. The passive components 330 and 332 may include high speed switching components formed on depleted CMOS devices, thereby enabling reconfigurable adaptive passive circuits. The package substrate 328 may have solder mask defined pads for surface mount components, and immersion gold plating may be used on the pads.

Figure 4:
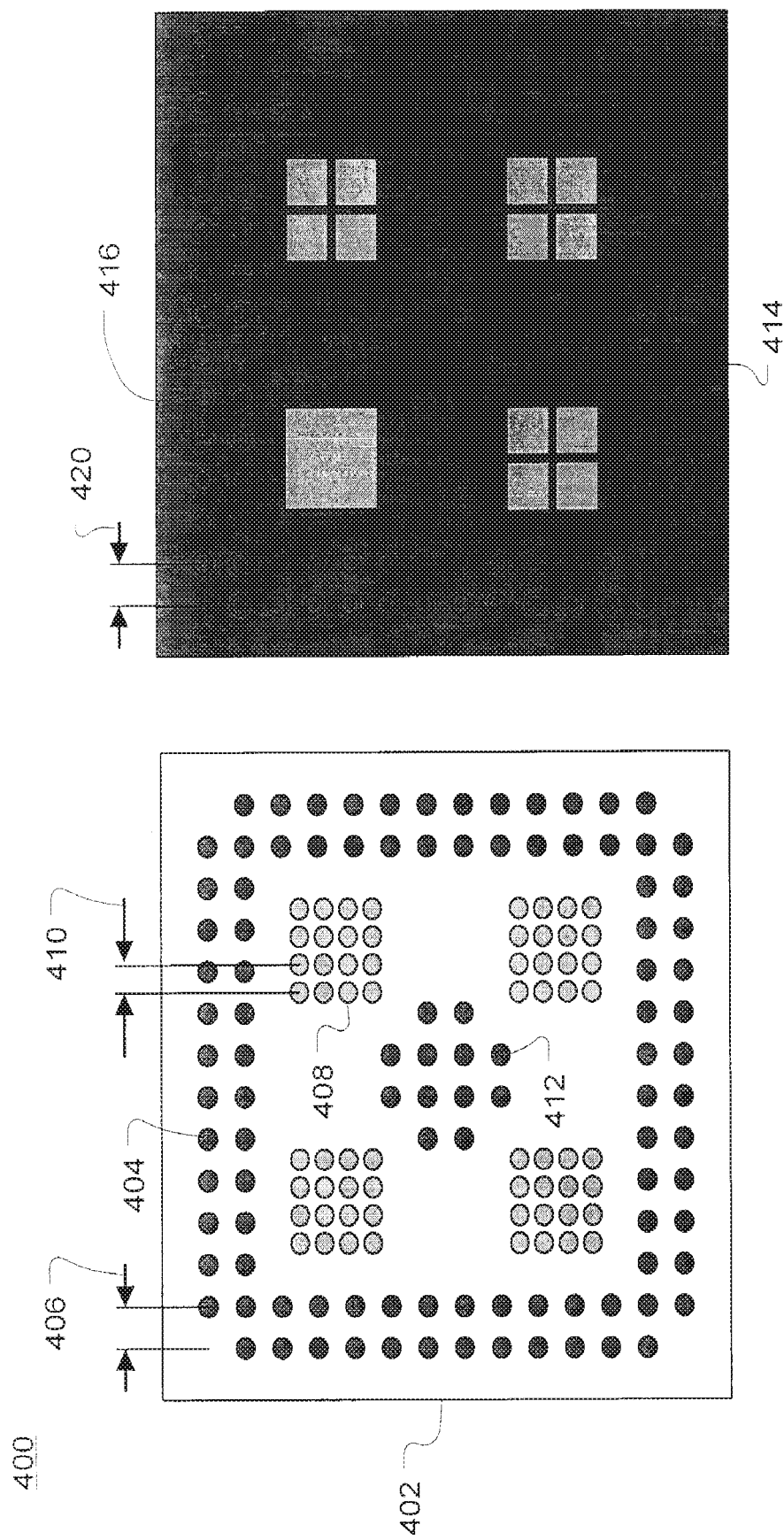
FIG. 4 illustrates (1) an exemplary array of solder balls for coupling a single package radio transceiver to a printed circuit board and (2) an exemplary array of solder pads on a printed circuit board to which a single package radio transceiver may be coupled.

The embodiment of the package 300 shown includes an array of solder balls 326 that may be used to electrically and mechanically couple the package 300 to a printed circuit board (not shown). Some of the solder balls 326 may be arranged in groups 324 that will collapse and coalesce during reflow, and form a large area connection convenient for grounding the package 300. FIG. 4 illustrates a substrate 402 of a package 400 with an array of signal solder balls 404 and an array of ground solder balls 408. The signal solder balls are distributed using a ball to ball pitch 406 that maintains the integrity of each solder ball 404. The solder balls 408 used for grounding are distributed with a narrower pitch 410 such that on reflow the balls coalesce to form a larger area connection. The embodiment shown by FIG. 4 includes solder balls 412 that may be used for power, ground, additional signals, or merely additional structural support without any electrical connectivity. A printed circuit board 414 may include arrays of exposed pads 416 and 418 similar to the arrays of solder balls. For example, the pitch 420 between exposed pads for the signals may be substantially similar to the pitch 406 for the signal solder balls 404. Ground pads 418 may be a single large area of exposed metal, or an array of large exposed areas, similar to those shown. The substrate 414 may have outer metal layer thicknesses of approximately 35 µm and inner metal layer thickness ranging from approximately 60 µm to 150 µm.

A Single Package Radio Transceiver Assembly Method

Figure 5:
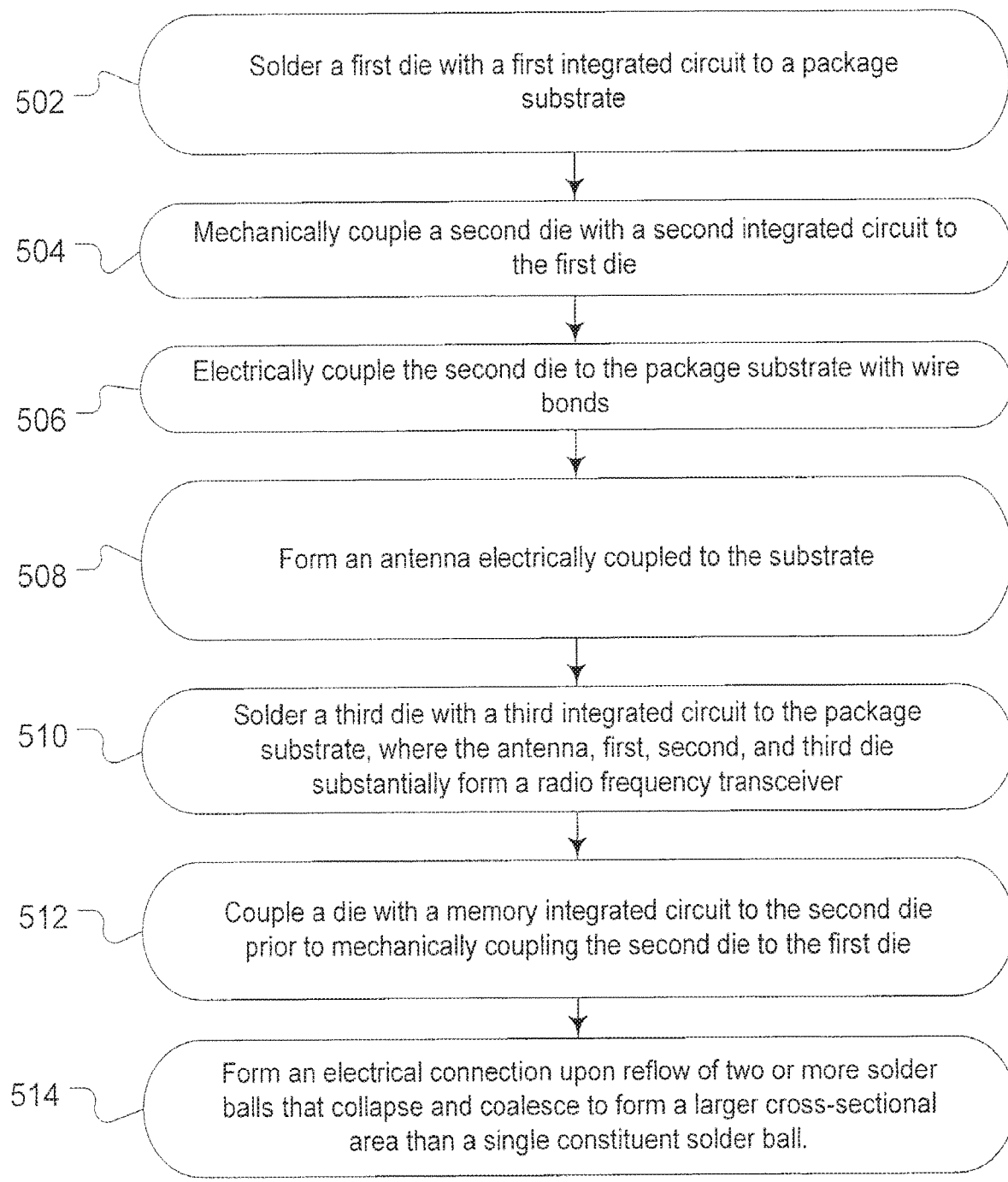
FIG. 5 illustrates an embodiment of a method of packaging a single package radio transceiver.

FIG. 5 illustrates an exemplary method of integrating a multiple die in a single integrated circuit package. The method illustrated may be used to package a combination of die wherein some of the die forming the radio transceiver are stacked and form a three dimensional integration. For example, the method of FIG. 5 includes soldering a first die to a package substrate having a layer of electrical traces and another layer of dielectric material 502. A method similar to one illustrated by FIG. 5 also includes mechanically coupling a second die to the first 504. To achieve a functional die stack, wire bonds electrically couple the second die to the package substrate 506.

As mentioned, the method illustrated by FIG. 5 results in a substantially integrated radio frequency transceiver. The method illustrated by FIG. 5 may be used to form a radio frequency transceiver capable of communicating according to any of a multitude of wireless standards that cover operation of networks ranging from personal area networks or local area networks to metropolitan area networks or wide area networks. Consequently, FIG. 5 illustrates forming an antenna electrically coupled to the substrate 508 and soldering a third die to the substrate, wherein the antenna, first, second, and third die substantially form a radio transceiver 510. The third die will often be substantially formed of gallium arsenide, silicon on sapphire, or silicon germanium, although other materials may often work as well.

In a radio frequency transceiver of the type whose assembly process is illustrated by FIG. 5, the second die substantially forms the often heavily computational, digital circuits of a base band communication processor. Some embodiments of a radio frequency transceiver couple memory to the digital circuits of the base band communication processor. Some of those embodiments may use a separate die for the memory and couple the memory die to the second die that substantially includes the digital circuits of the base band communications processor. A method of assembly, as illustrated by FIG. 5, may couple the memory die to the second die prior to mechanically coupling the second die to the first die 512.

Further, radio frequency transceivers may often benefit from grounding through large area electrical ground connections. As described above, such connections may form when two or more solder balls collapse and coalesce during reflow and form an electrical connection with larger cross-sectional area than a single constituent solder ball 514.

A System Embodiment that Includes a Single Package Radio Transceiver

Figure 6:
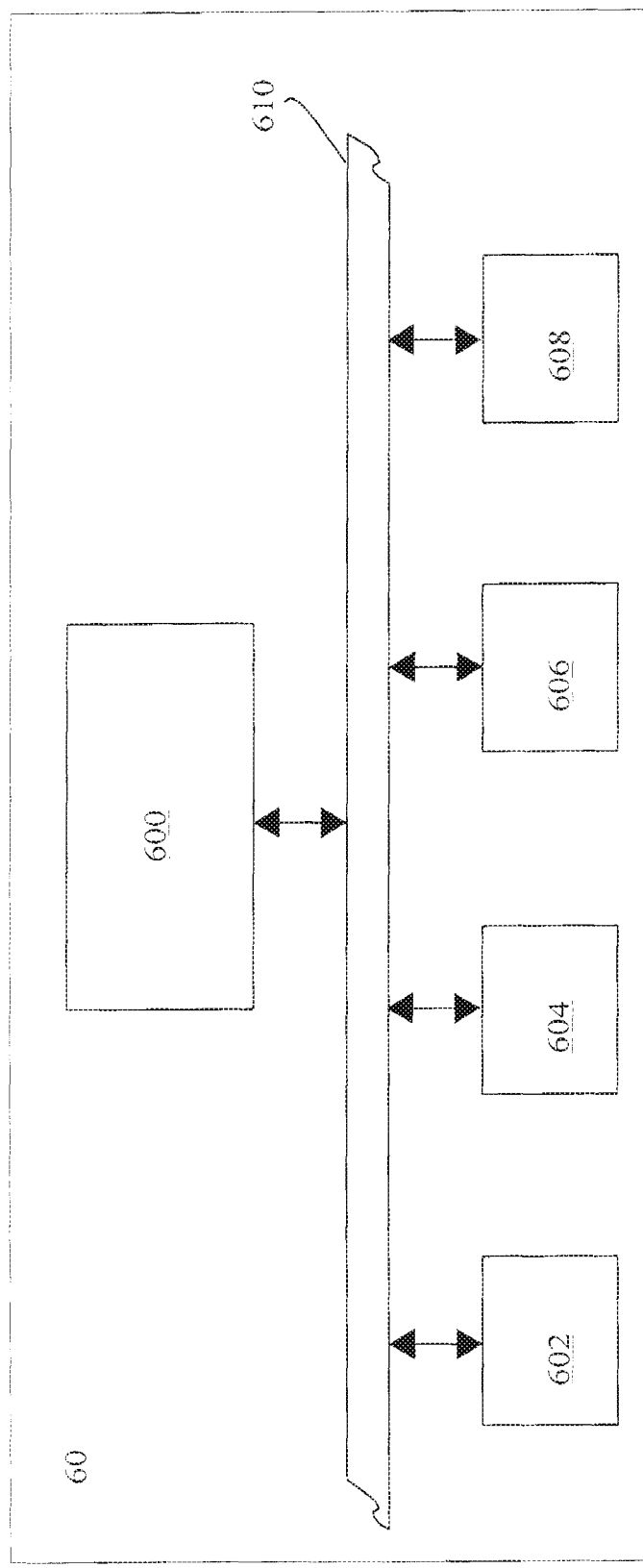
FIG. 6 illustrates a system schematic that incorporates an embodiment of a single package radio transceiver.

FIG. 6 illustrates a schematic representation of one of many possible systems 60 that incorporate an embodiment of a single package radio transceiver 600. In an embodiment, the package containing a radio frequency transceiver 600 may be an embodiment similar to that described in relation to FIG. 3. In another embodiment, the package 600 may also be coupled to a sub assembly that includes a microprocessor. In a further alternate embodiment, the integrated circuit package may be coupled to a subassembly that includes an application specific integrated circuit (ASIC). Integrated circuits found in chipsets (e.g., graphics, sound, and control chipsets) or memory may also be packaged in accordance with embodiments described in relation to a microprocessor and ASIC, above.

For an embodiment similar to that depicted in FIG. 6, the system 60 may also include a main memory 602, a graphics processor 604, a mass storage device 606, and an input/output module 608 coupled to each other by way of a bus 610, as shown. Examples of the memory 602 include but are not limited to static random access memory (SRAM) and dynamic random access memory (DRAM). Examples of the mass storage device 606 include but are not limited to a hard disk drive, a flash drive, a compact disk drive (CD), a digital versatile disk drive (DVD), and so forth. Examples of the input/output modules 608 include but are not limited to a keyboard, cursor control devices, a display, a network interface, and so forth. Examples of the bus 610 include but are not limited to a peripheral control interface (PCI) bus, PCI Express bus, Industry Standard Architecture (ISA) bus, and so forth. In various embodiments, the system 60 may be a wireless mobile phone, a personal digital assistant, a pocket PC, a tablet PC, a notebook PC, a desktop computer, a set-top box, an audio/video controller, a DVD player, a network router, a network switching device, a hand-held device, or a server.

Although specific embodiments have been illustrated and described herein for purposes of description of an embodiment, it will be appreciated by those of ordinary skill in the art that a wide variety of alternate and/or equivalent implementations calculated to achieve similar purposes may be substituted for the specific embodiments shown and described without departing from the scope of the present disclosure. For example, a processor and chipset may be integrated within a single package according to the package embodiments illustrated by the figures and described above, and claimed below. Alternatively, chipsets and memory may similarly be integrated, as may be graphics components and memory components.

Those with skill in the art will readily appreciate that the description above and claims below may be implemented using a very wide variety of embodiments. This detailed description is intended to cover any adaptations or variations of the embodiments discussed herein. Therefore, it is manifestly intended that this invention be limited only by the claims and the equivalents thereof.

What is claimed is:
1. A system, comprising:
a first die flip-chip electrically coupled to a package substrate upon a first layer thereof, wherein the package substrate is bumped on a second layer opposite the first layer, with an array of solder balls to electrically and mechanically couple to a printed circuit board;
wherein the array of solder balls includes:
a first plurality of solder regions at a bottom of the second layer, each region having a cross-sectional area less than a first value;
a second plurality of solder regions at the bottom of the second layer providing grounding for a radio trans- ceiver, each region having a cross-sectional area of value that is different than the first value;
a Base Band/Communication processor electrically wire-bonded to the package substrate at the first layer thereof, wherein the Base Band/Communication processor is mechanically coupled to the first die;
a memory die physically and electrically coupled to the Base Band/Communication processor, the memory die being electrically connected to the first die and physically connected to the Base Band/Communication processor;
a package cover that covers the first die, the wire bond die, and the memory die; and
at least one passive device on the die side of the package substrate.

2. The system of claim 1, wherein the package cover is a heat spreader.

3. The system of claim 1, further including an antenna coupled to the Base Band/Communication processor.

4. The system of claim 1, further including at least one passive component, disposed on the package substrate.

5. The system of claim 1, further including an underfill that touches the memory die and the Base Band/Communication processor.

6. The system of claim 1, further including:
an antenna coupled to the Base Band/Communication processor, wherein the antenna extends including the first layer and the second layer.

7. The system of claim 1, further including:
an antenna coupled to the Base Band/Communication processor, wherein the antenna extends including the first layer and the second layer; and
wherein the at least one passive component, disposed on the first layer is selected from an inductor component and a switching component.

8. The system of claim 1, further including:
an antenna coupled to the Base Band/Communication processor, wherein the antenna extends including the first layer and the second layer;
an underfill that touches the memory die and the Base Band/Communication processor,
wherein the at least one passive component, disposed on the first layer includes two passive components including an inductor component and a switching component; and
an underfill that touches the memory die and the Base Band/Communication processor.

9. The system of claim 1, further including:
an antenna coupled to the Base Band/Communication processor, wherein the antenna contacts the first layer and the second layer, and wherein the antenna contacts the package cover, and wherein the package cover contacts the first layer.

10. The system of claim 1, further including:
an antenna coupled to the Base Band/Communication processor, wherein the antenna contacts the first layer and the second layer, and wherein the antenna contacts the package cover, and wherein the package cover contacts the first layer; and
an underfill that touches the memory die and the Base Band/Communication processor.

11. A system, comprising:
a first die flip-chip electrically coupled to a package substrate upon a first layer thereof,
wherein the package substrate is bumped opposite the first layer on a second layer at a bottom, with an array of solder bans to electrically and mechanically couple to a printed circuit board;
a Base Band/Communication processor electrically wire-bonded to the package substrate at the first layer thereof, wherein the Base Band/Communication processor is mechanically coupled to the first die;
a memory die physically and electrically coupled to the Base Band/Communication processor, the memory die being electrically connected to the first die and physically connected to the Base Band/Communication processor;
an antenna coupled to the Base Band/Communication processor;
an epoxy that touches the memory die and the Base Band/Communication processor; and
two passive components on the first layer.

12. The system of claim 11, wherein the epoxy is an underfill.

13. The system of claim 11, further including: a package cover that covers the first die, the wire bond die, and memory die.

14. The system of claim 11, further wherein the two passive components include an inductor component and a switching component.

15. The system of claim 11, further including:
an antenna that passes into the package substrate at the first side;
wherein the epoxy is an underfill;
a package cover that covers the first die, the wire bond die, and the memory die; and
wherein the two passive components include an inductor component and a switching component;
wherein the antenna contacts the package cover, and wherein the package cover contacts the first layer.

16. A system, comprising:
a first die flip-chip electrically coupled to a package substrate upon a first layer thereof, wherein the package substrate is bumped opposite the first layer at a second layer at a bottom of the second layer, with an array of solder balls to electrically and mechanically couple to a printed circuit board;
a Base Band/Communication processor electrically wire-bonded to the package substrate at the first layer thereof, wherein the Base Band/Communication processor is mechanically coupled to the first die;
a memory die physically and electrically coupled to the Base Band/Communication processor, the memory die being electrically connected to the first die and physically connected to the Base Band/Communication processor;
an antenna coupled to the Base Band/Communication processor, wherein the antenna passes into the package substrate at the first layer;
an epoxy that touches the memory die and the Base and/Communication processor, wherein the epoxy is an underfill; and
a package cover that covers the first die, the wire bond die, and the memory die.

17. The system of claim 16, wherein the antenna is a copper stud.

18. The system of claim 16, wherein the antenna is disposed in the package substrate and grounded at the second layer thereof, and wherein a group of the array of solder balls is grouped and capable of reflowing and coalescing where the antenna is grounded.

19. The system of claim 16, wherein the antenna is a copper stud.

20. The system of claim 19, wherein the antenna is disposed in the package substrate, and wherein a group of the array of solder balls is grouped and capable of reflowing and coalescing.

* * * * *

UNITED STATES PATENT AND TRADEMARK OFFICE
CERTIFICATE OF CORRECTION

PATENT NO. : 10,727,567 B2
APPLICATION NO. : 16/594889
DATED : July 28, 2020
INVENTOR(S) : Mohamed A. Megahed It is certified that error appears in the above-identified patent and that said Letters Patent is hereby corrected as shown below:

On the Title Page

In "Related U.S. Application Data", in Column 1, Line 1, delete "(60)" and insert --(63)-- therefor In the Claims In Column 8, Line 3, in Claim 11, delete "bans" and insert --balls-- therefor In Column 8, Line 57, in Claim 16, delete "and/Communication" and insert --Band/Communication-- therefor Signed and Sealed this
Twenty-eighth Day of December, 2021

Drew Hirshfeld
*Performing the Functions and Duties of the*
*Under Secretary of Commerce for Intellectual Property and*
*Director of the United States Patent and Trademark Office*